United States Patent
Roy et al.

(10) Patent No.: US 7,036,067 B2
(45) Date of Patent: Apr. 25, 2006

(54) ERROR DETECTION FOR MULTI-STREAM COMMUNICATIONS

(75) Inventors: Pulakesh Roy, Sunnyvale, CA (US);
Tibor Boros, San Francisco, CA (US);
Veerendra Bhora, Sunnyvale, CA (US)

(73) Assignee: ArrayComm, LLC, San Jose, CA (US)

( * ) Notice: Subject to any disclaimer, the term of this patent is extended or adjusted under 35 U.S.C. 154(b) by 151 days.

(21) Appl. No.: 10/402,717

(22) Filed: Mar. 28, 2003

(65) Prior Publication Data
US 2004/0193993 A1 Sep. 30, 2004

(51) Int. Cl.
*H03M 13/00* (2006.01)

(52) U.S. Cl. .................. 714/758; 714/755; 714/781

(58) Field of Classification Search ........... 714/752, 714/758, 755, 781, 786
See application file for complete search history.

(56) References Cited

U.S. PATENT DOCUMENTS

| | | | | |
|---|---|---|---|---|
| 6,085,349 A | * | 7/2000 | Stein | 714/778 |
| 6,223,320 B1 | * | 4/2001 | Dubey et al. | 714/757 |
| 6,532,564 B1 | * | 3/2003 | Ito et al. | 714/752 |

FOREIGN PATENT DOCUMENTS

WOPCT   SEARCH REPORT   11/2004

* cited by examiner

*Primary Examiner*—Albert Decady
*Assistant Examiner*—Esaw T. Abraham
(74) *Attorney, Agent, or Firm*—Blakely Sokoloff Taylor & Zafman (57) ABSTRACT

According to an embodiment of the invention, a method and apparatus are described for error detection for multi-stream communication. Under an embodiment of the invention, a method for producing an error word for a data stream comprises computing an intermediate error word for each of a plurality of data sub-streams, the data stream being equivalent to a concatenation of the plurality of data sub-streams; and combining the intermediate error words to produce the error word for the data stream.

44 Claims, 6 Drawing Sheets

Figure 2

$$B_1 = \begin{bmatrix}
0 & 1 & 0 & 1 & 1 & 1 & 0 & 1 & 0 & 1 & 0 & 0 & 0 & 0 & 0 & 1 \\
1 & 0 & 1 & 1 & 1 & 0 & 1 & 0 & 1 & 0 & 0 & 0 & 0 & 0 & 1 & 0 \\
0 & 1 & 1 & 0 & 0 & 1 & 0 & 1 & 0 & 0 & 1 & 0 & 0 & 1 & 0 & 1 \\
1 & 1 & 0 & 0 & 1 & 0 & 1 & 0 & 0 & 1 & 0 & 0 & 1 & 0 & 1 & 0 \\
1 & 0 & 0 & 0 & 0 & 1 & 0 & 0 & 1 & 0 & 1 & 1 & 0 & 1 & 0 & 1 \\
0 & 0 & 0 & 1 & 1 & 0 & 0 & 1 & 0 & 1 & 0 & 0 & 1 & 0 & 1 & 1 \\
0 & 0 & 1 & 1 & 0 & 0 & 1 & 0 & 1 & 0 & 0 & 1 & 0 & 1 & 1 & 0 \\
0 & 1 & 1 & 0 & 0 & 1 & 0 & 1 & 0 & 0 & 1 & 0 & 1 & 1 & 0 & 0 \\
1 & 1 & 0 & 0 & 1 & 0 & 1 & 0 & 0 & 1 & 0 & 1 & 1 & 0 & 0 & 0 \\
1 & 0 & 0 & 0 & 0 & 1 & 0 & 0 & 1 & 0 & 1 & 0 & 0 & 0 & 0 & 1 \\
0 & 0 & 0 & 1 & 1 & 0 & 0 & 1 & 0 & 0 & 0 & 0 & 0 & 0 & 1 & 1 \\
0 & 0 & 1 & 1 & 0 & 0 & 1 & 0 & 0 & 0 & 0 & 0 & 0 & 1 & 1 & 0 \\
0 & 1 & 1 & 0 & 0 & 1 & 0 & 0 & 0 & 0 & 0 & 0 & 1 & 1 & 0 & 0 \\
1 & 1 & 0 & 0 & 1 & 0 & 0 & 0 & 0 & 0 & 0 & 1 & 1 & 0 & 0 & 0 \\
1 & 0 & 0 & 0 & 0 & 0 & 0 & 0 & 0 & 0 & 1 & 0 & 0 & 0 & 0 & 1 \\
0 & 0 & 0 & 1 & 0 & 0 & 0 & 0 & 0 & 0 & 0 & 0 & 0 & 0 & 1 & 1
\end{bmatrix}$$

ERROR DETECTION FOR MULTI-STREAM COMMUNICATIONS

FIELD OF THE INVENTION

The invention relates generally to the field of communications. More particularly, the invention relates to error detection for multi-stream communications.

DESCRIPTION OF THE RELATED ART

In communications, the accuracy of received data is often verified using an error word, such as a cyclic redundancy check (CRC) word. A transmitter uses the information bits in a communication to calculate a reference error word using an error word generator, the error word generally being transmitted along with the information bits in the same data packet. A receiver generally then calculates the error word again by passing the received information through an identical error word generator and compares the calculated error word with the reference error word, which is usually embedded in the received data stream. Based on the comparison of error words, the receiver may determine the accuracy of the received data.

In some communication systems, as for example systems using multi-level modulation schemes, the order at which received data sub-streams are decoded may be different from the order at which the data sub-streams were used to generate the reference error word at the transmitter. For this reason, in conventional systems a receiver is required to restore the original order of the data sub-streams before passing the data sub-streams through the error word generator. However, there may be problems associated with this approach. The receiver generally requires extra data storage to restore the original order of the data sub-streams. Even if the final destination of the data sub-streams is RAM memory, the receiver will be required to write the data sub-streams to the RAM in order to restore the original order, read the data back, and pass the entire data stream through the error word generator. Because of this, additional processing time is required at the end of decoding. The extra processing time requirement for the error word generator may greatly constrain high data rate communication systems.

BRIEF SUMMARY OF THE INVENTION

A method and apparatus are provided for error detection for multi-stream communications. According to an embodiment of the invention, a method for producing an error word for a data stream comprises computing an intermediate error word for each of a plurality of data sub-streams, the data stream being equivalent to a concatenation of the plurality of data sub-streams; and combining the intermediate error words to produce the error word for the data stream.

Other features of the present invention will be apparent from the accompanying drawings and from the detailed description that follows.

BRIEF DESCRIPTION OF THE SEVERAL VIEWS OF THE DRAWINGS

The present invention is illustrated by way of example, and not by way of limitation, in the figures of the accompanying drawings in which like reference numerals refer to similar elements, and in which.

DETAILED DESCRIPTION OF THE INVENTION

Overview

According to an embodiment of the invention, an error word generator, such as a CRC generator, receives multiple data sub-streams and produces an error word for the entire data stream.

In an embodiment of the invention, a first error word is calculated for a data stream. The data stream is then divided into multiple data sub-streams, and the data sub-streams and the error word are transmitted by a transmitter. The data sub-streams may vary in length and may be transmitted in any order. The data sub-streams may be transmitted sequentially, in parallel, or in a combination of sequential and parallel transmissions. The data sub-streams may be transmitted by varying methods. The transmitter may transmit the data sub-streams simultaneously through different communication channels. The data sub-streams may arrive at a receiver in any arbitrary order. The transmitter may transmit the data sub-streams sequentially but in an order that is different from the original order of the data sub-streams in the original data stream. The receiver receives and processes the data sub-streams, calculates an intermediate error word for each data sub-stream, and combines the intermediate error words to produce a second error word for the entire data stream. The first error word and the second error word may be compared to determine whether the received data is accurate.

Under an embodiment of the invention, a receiver may decode data sub-streams in an arbitrary order. The decoding may happen simultaneously or sequentially or any combination of simultaneous and sequential decoding. Some sub-streams may require different demodulation and decoding techniques than others. The order at which the data sub-streams are processed and leave the receiver may be very different from the order of the data sub-streams in the original data stream when the reference error word was generated, although the order of data within each data sub-stream remains unchanged.

In a conventional error word generator, the received data sub-streams are organized in the order of the original data stream, and then the ordered data is passed through an error word generator. The conventional processing requires either extra storage for the data or extra processing time to wait until all data streams have been received and placed in order before beginning generation of an error word for the received data.

Under an embodiment of the invention, an error word generator, including but not limited to a CRC generator, computes an intermediate error word for each data substream. The intermediate results are combined to obtain the error word for the original data stream. The intermediate error words for the data sub-streams can be generated in parallel. The intermediate error word for each data substream can be generated as the data sub-stream is decoded and demodulated because the data in the sub-stream doesn't require any rearrangement. For this reason the process of generating intermediate error words does not require data storage. Further, the combination of the intermediate results is extremely fast, and therefore extra processing time is not required. The error word for the concatenated data substreams is available as soon as the receiver finishes decoding and demodulation for all of the data sub-streams.

An example of an error word generator under an embodiment of the invention is a CRC generator that produces a CRC word. However, the invention is not limited to a CRC generator. An embodiment of the invention may be utilized with any error word generator that uses a linear code.

Figure 1:
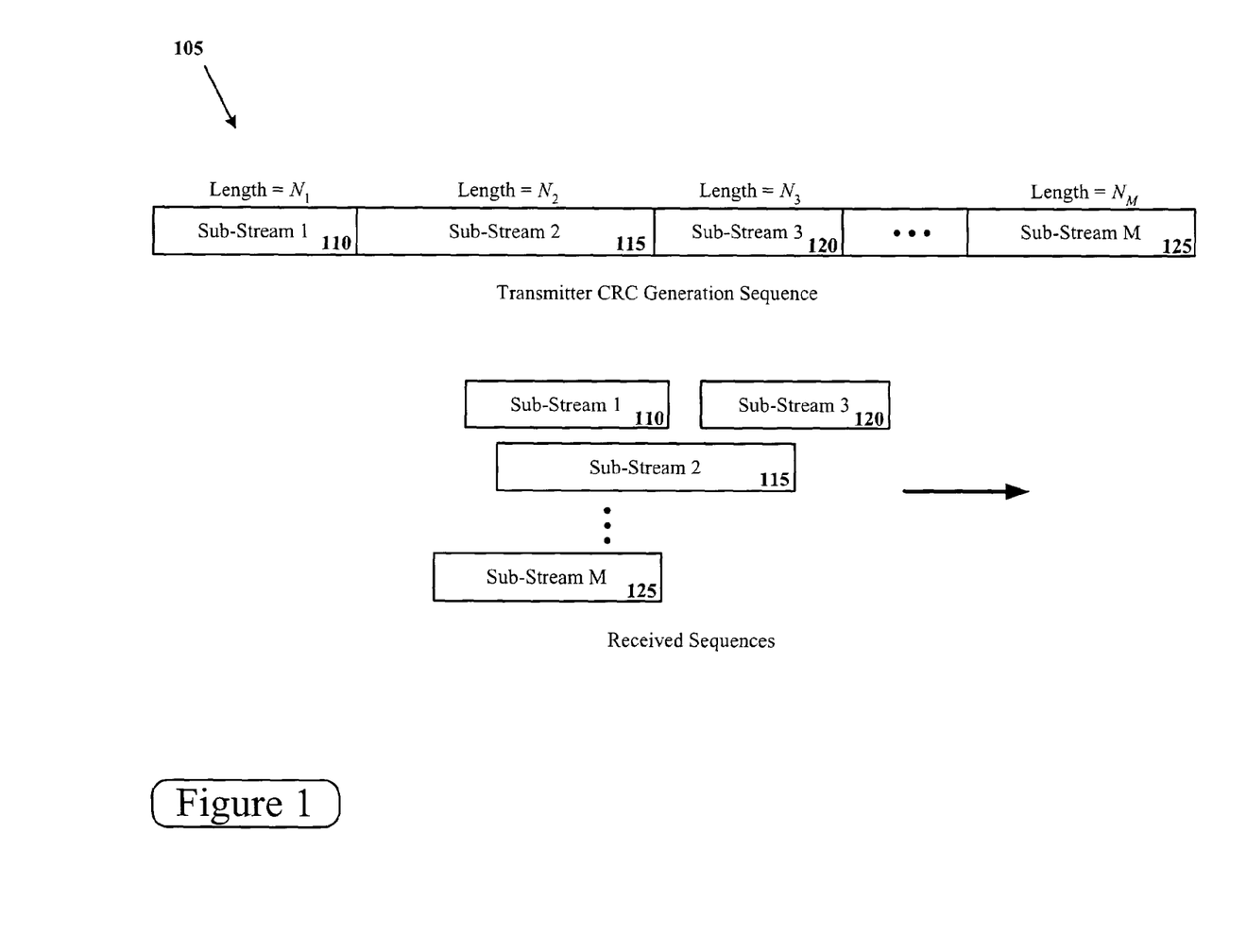
FIG. 1 is an illustration of a data stream divided into multiple data sub-streams that may be processed using an embodiment of the invention.

FIG. 1 is a illustration of communications comprising multiple sub-streams of data. The communications initially comprises a data stream 105 that comprises M data sub-streams. The data sub-streams are of varying lengths, including a data sub-stream 1 110 of length $N_1$, a data sub-stream 2 115 of length $N_2$, and continuing through a data sub-stream M 125 of length $N_M$. The data stream 105 is applied to the CRC generator or other error word generator, producing a error word for the data stream.

For transmission, the data stream 105 is divided into the M data sub-streams, which may arrive at varying times and in an arbitrary order. The sub-streams may overlap in arrival or may arrive in sequence. In one example, data sub-stream 3 120 arrives first, with data sub-stream 1 105 following in sequence. The arrival of data sub-stream 2 115 then overlaps with data sub-stream 3 120 and data sub-stream 1 110, and the arrival of data sub-stream M 125 overlaps with data sub-stream 1 110.

Error Word Generator

An embodiment of the invention may be implemented as a cyclic redundancy (CRC) generator. A CRC generator comprises a linear feedback shift register whose operation can be described using the following state space equations:

$$s_{n+1} = As_n + bu_n$$

$$y_n = s_n \quad (1)$$

In Equation (1), $y_n$, $s_n$ and $u_n$ represent respectively the output, the state, and the input at time instant n. A is the state transition matrix of size P×P and b is the input matrix of size P×1, where P is the order of the generator.

An input data stream of length K is broken into M data sub-streams such that that the original data stream can be formed by the concatenation of the data sub-streams. The sum of the lengths of the data sub-streams is equal to the length of the original data stream:

$$\sum_{j=1}^{M} N_j = K \quad (2)$$

The reference CRC word c can be obtained by passing the length-K input data stream through a CRC generator. The intermediate CRC that is generated by passing the $j^{th}$ data sub-stream through the CRC generator is denoted as $c_j$. The CRC word c is calculated from intermediate CRC words $c_1$, $c_2$, ... $c_M$ as $$c = \sum_{j=1}^{M} B_j c_j \quad (3)$$

Equation 3 indicates that that a linear operator is applied to each of the intermediate CRC words $c_j$ and the results of the linear operations are then added together. In Equation (3), the $B_j$ factors are matrices of size P×P and are defined as:

$$B_j = A^{\sum_{i=j+1}^{M} N_i} \quad (4)$$

$$B_M = I_P$$

Figure 2:
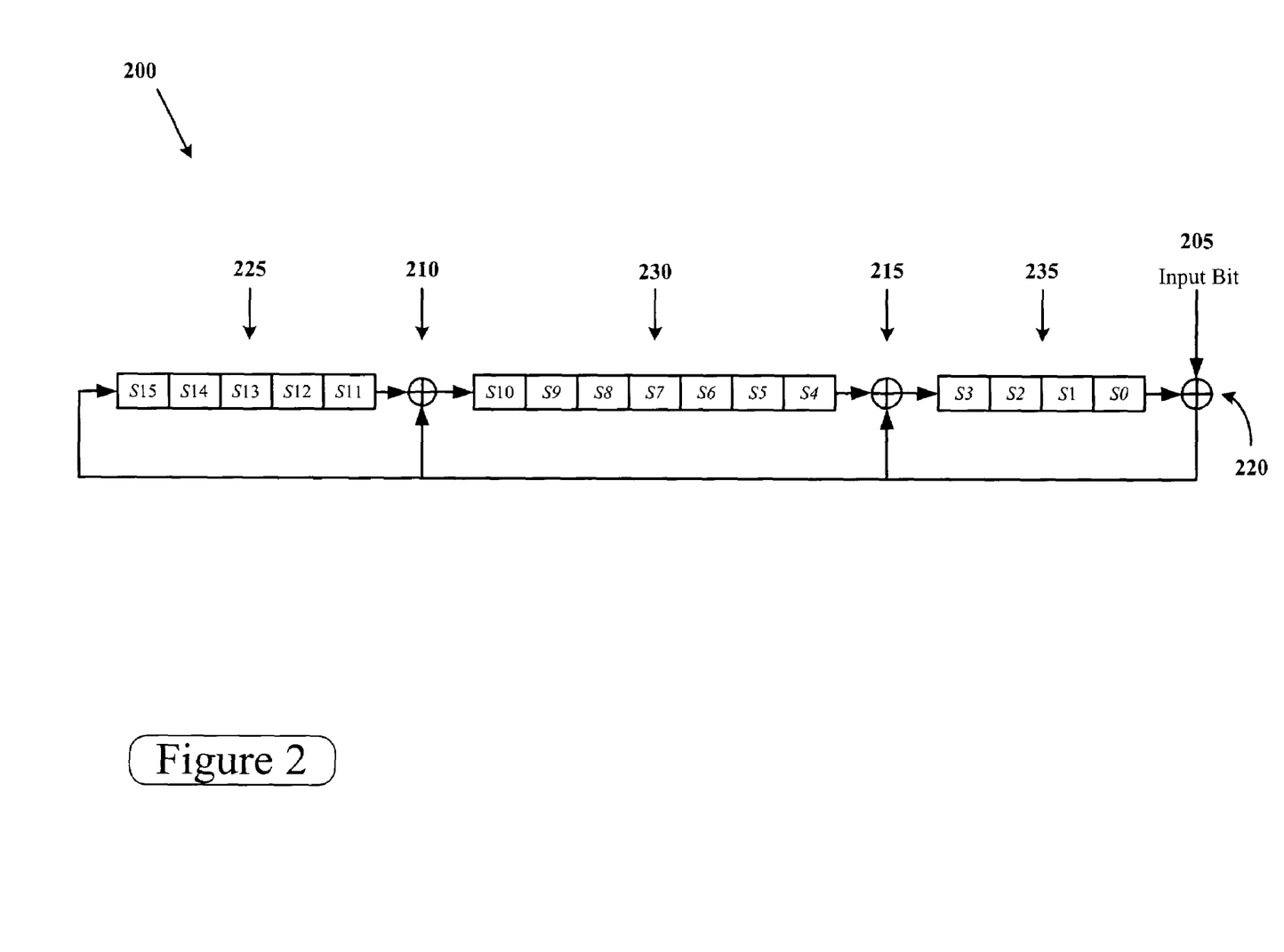
FIG. 2 illustrates a cyclic redundancy (CRC) generator for a particular polynomial.

The matrix of $B_j$ can be pre-calculated and stored in the j-th ROM of a CRC generator according to an embodiment of the invention. Under an embodiment of the invention, the factors $B_j$ are applied to the intermediate CRC word produced for each of a number of data sub-streams, and the results are then combined to produced the CRC word for the entire data stream In a particular example, a CRC generator with a polynomial $g(x)=x^{16}+x^{12}+x^5+1$ may be used to calculate a 16-bit CRC word for a binary bit sequence. The generator may be implemented using a linear feedback shift register (LFSR) structure. An implementation of a CRC generator for the polynomial is shown in FIG. 2. The LFSR includes a first adder 210, a second adder 215, and a third adder 220. The state $s_n$ is stored in a shift register as S0 though S15. For this CRC polynomial, the shift register includes a first shift portion 225 comprising elements S15 through S11, a second shift portion 230 comprising elements S10 through S4, and a third shift portion 235 comprising elements S3 through S0. An input 205 is applied to the third adder 220, which adds the input to the value stored in S0. The result of the addition is fed back to be stored in S15 and to be applied to the first adder 210 and the second adder 215. The first adder 210 adds the result from the third adder 220 to the value stored in S11 and the sum is stored in S10. The second adder 215 adds the result from the third adder 220 to the value stored in S4 and the sum is stored in S3. The CRC word for the data stream is stored in the shift register after the processing of all data in the data stream.

The state-state space variables and the constants for this example of a CRC generator are defined over GF(2) (Galois Field (2)) as follows:

$$s_n = [S_0 \quad S_1 \quad \Lambda \quad S_{15}]^T \quad (5)$$

$$b = [0 \ 0 \ 0 \ 1 \ 0 \ 0 \ 0 \ 0 \ 0 \ 0 \ 1 \ 0 \ 0 \ 0 \ 0 \ 1]^T$$

$$A = \begin{bmatrix} b & I_{15} \\ & 0 \ \Lambda \ 0 \end{bmatrix}$$

In a particular example, there are two data sub-streams, stream1 and stream2. In this example, the data sub-streams are the output of a multi-level decoder that generates the output streams simultaneously but at different rates. In a conventional architecture, a CRC word would be calculated by passing first stream1 and then stream2 through a CRC generator. In this example for a particular modulation class the lengths of stream1 and stream2 are $N_1$=666 and $N_2=1135$, respectively. According to an embodiment of the invention, the data sub-streams are passed through separate but identical CRC generators. The output of the generator used for stream1 is $c_1$ (a first 16×1 binary vector) and the output of the generator used for stream2 is $c_2$ (a second 16×1 binary vector). The output of a CRC generator if first stream1 and then stream2 are passed through the CRC generator is c (16×1 binary vector), which is the desired CRC word. According to equation (3) and (4), c can be computed from $c_1$ and $c_2$ as follows:

$$c = B_1 \times c_1 + c_2 \qquad (6)$$
$$= A^{1135} \times c_1 + c_2$$

Figure 3:
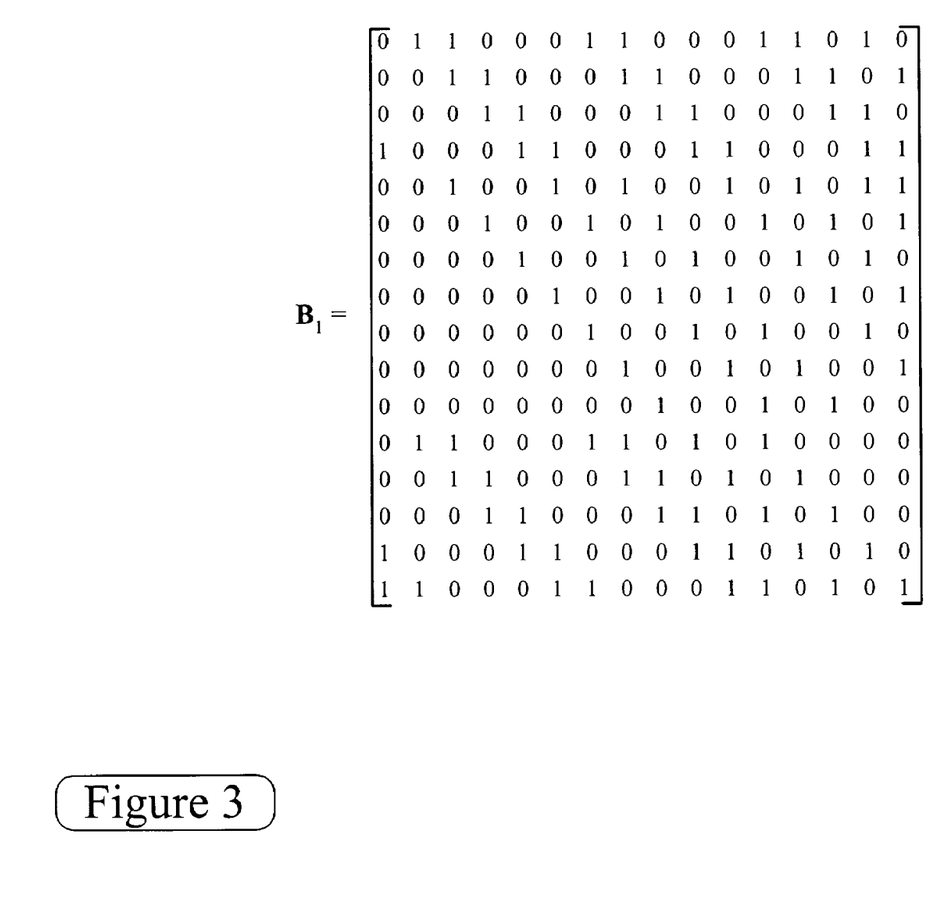
FIG. 3 is an illustration of a matrix factor for a particular CRC generator.

Knowing matrix A, which is fixed for a particular CRC generator, it is possible to pre-calculate the value of $B_1$. Because the variables are binary, all the operations of equation (6) can be performed using the arithmetic in GF(2). In this field, multiplication is converted to a logical AND operation and addition is converted to a logical XOR operation. The pre-calculated value of $B_1$ may be stored in a first memory and is used to transform the output the first CRC before combining with the output of the second CRC generator. The value of the matrix $B_1$ for this particular CRC generator example is shown in FIG. 3.

Figure 4:
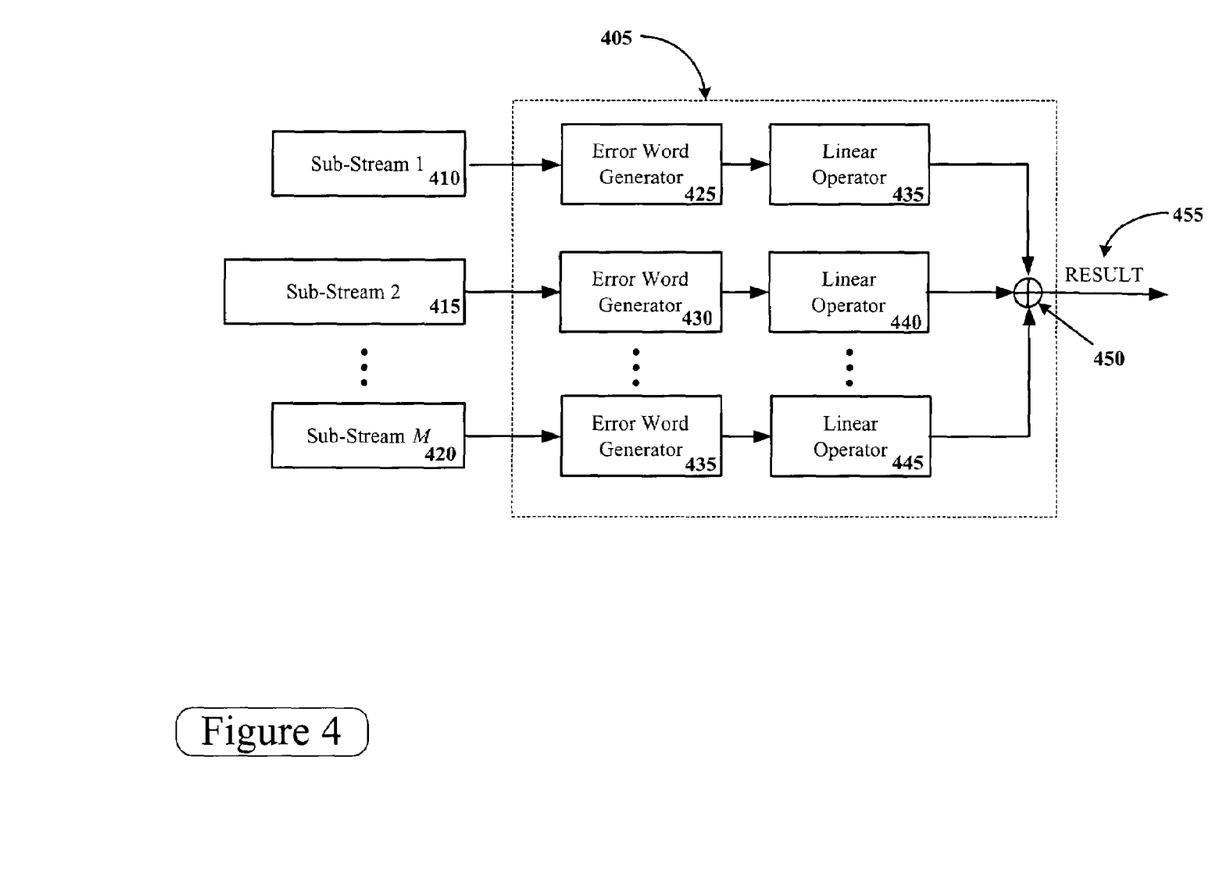
FIG. 4 is an example of an error word generator receiving multiple data sub-streams under an embodiment of the invention.

FIG. 4 illustrates an embodiment of an error word generator according to an embodiment of the invention. In this example, the error word generator 405 produces an error word for a data stream that has been divided into multiple data sub-streams. To process the multiple data sub-streams, the generator will produce an intermediate error word for each data sub-stream, apply a linear operator to the intermediate error word, and combine the results to produce an error word for the original data stream. The plurality of data sub-streams, shown as data sub-stream 1 410, data sub-stream 2 415, and continuing through data sub-stream M 420, arrive at the error word generator in arbitrary order and time. Each data sub-stream is processed by a separate error word generator, shown as a first error word generator 425, a second error word generator 430, and continuing through an $M^{th}$ error word generator 435.

The linear operators for the intermediate error words are shown as a first linear operator 435, a second linear operator 440, and continuing through an $M^{th}$ linear operator 445. The factor for the $M^{th}$ linear operator 445 may reduce to an identity function and thus the operator may be eliminated. The result of the first linear operator 435, a second linear operator 440, and continuing through an $M^{th}$ linear operator 445 are added by an operator 450 to produce a result 455 equal to the error word for the entire data stream.

Figure 5:
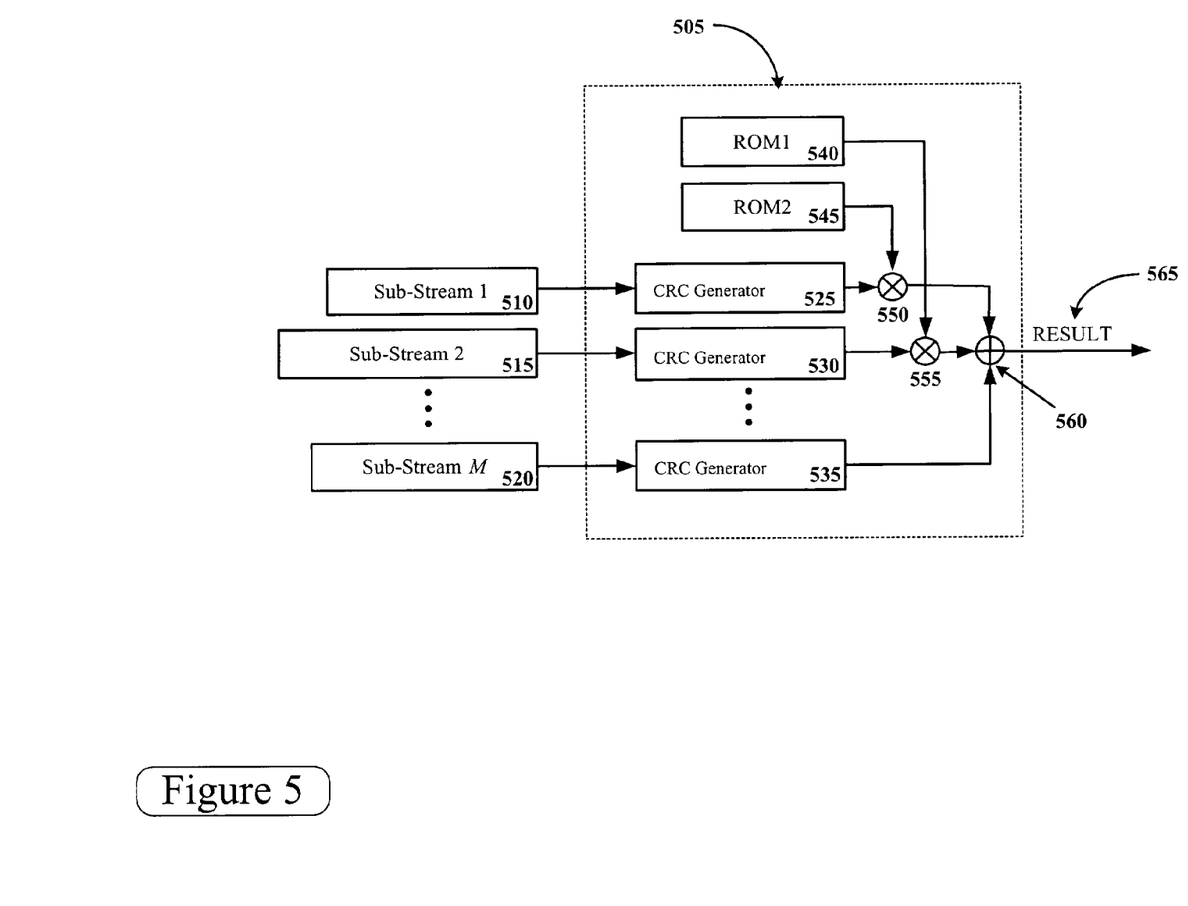
FIG. 5 is an example of a CRC generator receiving multiple data sub-streams under an embodiment of the invention.

FIG. 5 illustrates a specific embodiment of an error word generator according to an embodiment of the invention, although many other embodiments are also possible. In this example, the error word generator 505 comprises a CRC word generator to produce a CRC word for a data stream that has been divided into multiple data sub-streams. To process the multiple data sub-streams, the generator will produce an intermediate CRC word for each data sub-stream, multiply each intermediate CRC word by a factor, and add the resulting products to product a CRC word for the original data stream. The plurality of data sub-streams, shown as data sub-stream 1 510, data sub-stream 2 515, and continuing through data sub-stream M 520, arrive at the CRC word generator in arbitrary order and time. Each data sub-stream is processed by a separate CRC word generator, shown as a first CRC word generator 525, a second CRC word generator 530, and continuing through an $M^{th}$ CRC word generator 535.

The factors for each intermediate CRC word are stored in read-only memory. A first factor is stored in ROM1 545 and a second factor is stored in ROM2 540. The factors continue through the $(M-1)^{th}$ ROM for data sub-stream M-1. As shown above, the factor for the $M^{th}$ intermediate CRC word is the identity matrix and therefore no factor is required for CRC generator 535. The result of the first CRC word generator 525 is multiplied with the factor contained in ROM1 545 by first multiplier 550, the result of the second CRC word generator 530 is multiplied with the factor contained in ROM2 540 by second multiplier 555, continuing through the remaining data sub-streams, with the results added by adder 560 to produce a result 565 equal to the CRC word for the entire data stream.

Card Architecture

Figure 6:
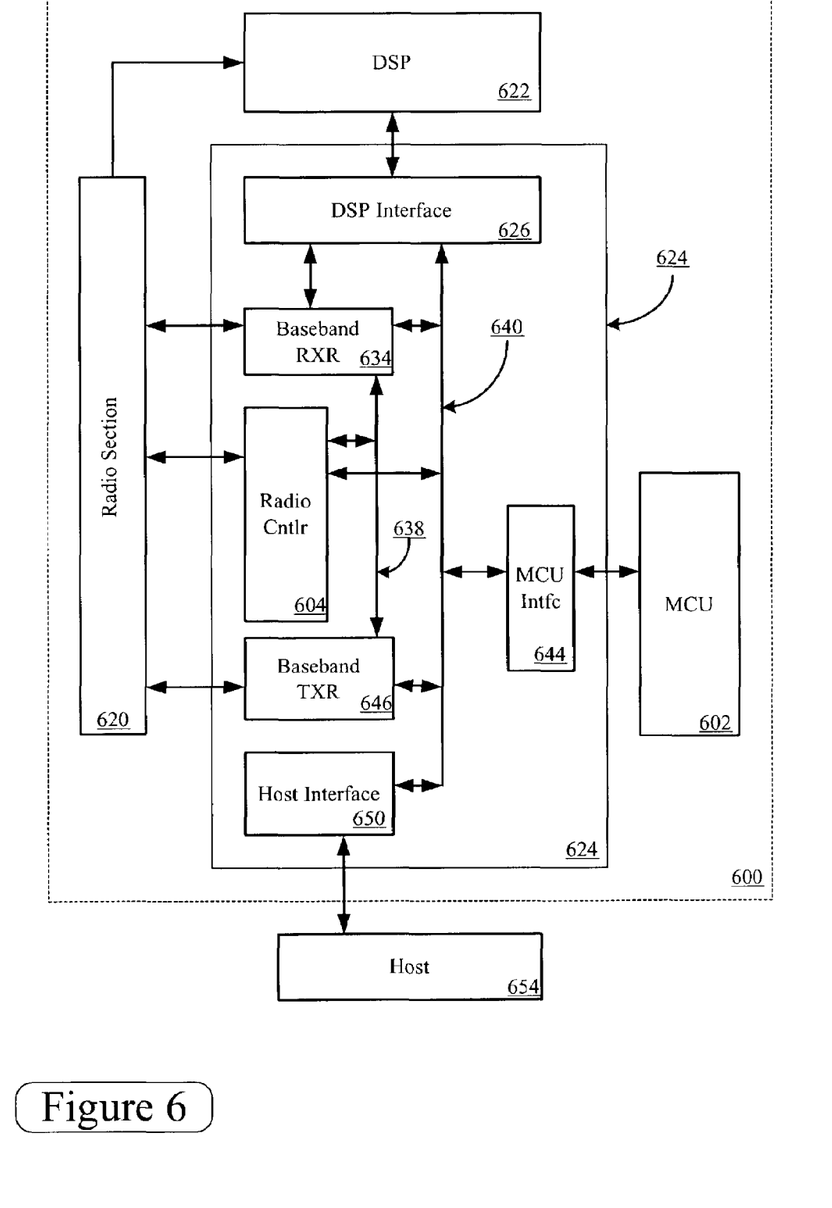
FIG. 6 illustrates a removable device in which an embodiment of the invention may be implemented.

FIG. 6 is a block diagram of a removable device, which may be a computer adapter card 600 such as a PCMCIA (Personal Computer Memory Card International Association) card, SD (Secure Digital) card, MultiMediaCard or USB (Universal Serial Bus) device, in which embodiments of the invention can be implemented. The card 600 is coupled with a host 654 at a port or slot. The host system can be a mobile computer (for example a laptop, notebook, or tablet PC), a desktop computer, a hand-held device (for example palmtops, PDAs, cellular phones, digital cameras), or any other data source or sink including other computers, computer peripherals, and other electronic products.

The card 600 includes a high-layer controller or master control unit (MCU) 602 to perform higher layer processing, such as layer-2, layer-3, and layer-4 processing. The MCU 602 is coupled through an MCU interface 644 to a physical layer processor, such as an ASIC (Application Specific Integrated Circuit) 624, to perform lower layer processing, such as layer-0 and layer-1 processing. A radio section 620 is coupled to the ASIC 624 through a baseband receiver 634, a baseband transmitter or digital modulator 634, and a radio controller 604. A DSP (digital signal processor) 622 is coupled to the ASIC 624 through a DSP interface 626 and to the radio section 620 to process data packets received and transmitted through the radio section 620. As one example, on an uplink the MCU 602 can provide layer-2 format data to the ASIC 624 via the MCU interface 644. The ASIC 624 processes the data to generate a modulated transmit signal that is provided to the radio section 620.

The DSP interface 626 is included in the ASIC 624 to interface data, interrupts, and control signals between the DSP 624 and the ASIC 626, the baseband receiver 634, and the baseband transmitter 646. A radio controller line 638 conveys radio control signals within the ASIC 624. An MCU line 640 conveys controls and data from the MCU 602 within the ASIC 624. The radio controller 604 controls the components within the radio section 620. The radio controller 604 contains an instruction execution unit and controls power and timing for components of the radio. The ASIC 624 also includes a PCMCIA or other type of host interface 650 to provide an interface with the PCMCIA port or other port or slot of the host 654.

In the card 600 shown in FIG. 6, the ASIC 624, the radio section 620, and the DSP 622 each reside on separate chips or modules, although this is not required. In an alternate embodiment any one or more, or all, of such items may can be combined on a common chip or module. In addition, while the interfaces and most registers described above are shown as residing on the ASIC, any one or more of these interfaces and memories can reside on one of the other chips or on an additional chip. In yet another embodiment of the invention any portion of the MCU, the ASIC, the DSP, or the radio can be integrated with the host system or implemented in software by executing instructions within a processor of the card, the host or an auxiliary system.

General Matters

The present invention can be implemented in an i-BURST™ personal broadband access system. i-BURST™ is a trademark of ArrayComm, Inc. of San Jose, Calif. The i-BURST™ personal broadband access system provides a high-speed, wireless connection, for example to the Internet, for many wireless devices, such as portable computer systems (for example laptops), handheld devices (for example palmtops), digital cameras, game consoles, Internet appliances, etc. The i-BURST™ personal broadband access system provides speeds of more than 1 Mbps per user and up to 40 Mbps at any location, freedom to move, and an always-on connection.

In addition to i-BURST™ systems, embodiments of the present invention can be implemented in, low-mobility cellular and hot spot wireless communications systems. The present invention, while described in the context of i-BURST™ protocols is in no way restricted to using the i-BURST™ air interface or to TDMA systems, but may be utilized as part of any communication receiver, including CDMA systems using the IS-95 or WCDMA air interface, the GSM (Global System Mobile) air interface, the PHS (Personal Handyphone System defined by the Association of Radio Industries and Businesses ARIB, Japan) interface, IEEE 802.11, and WIFI, and also for wireless local loop (WLL) systems.

In the description above, for the purposes of explanation, numerous specific details are set forth in order to provide a thorough understanding of the present invention. It will be apparent, however, to one skilled in the art that the present invention may be practiced without some of these specific details. In other instances, well-known circuits, structures, devices, and techniques have been shown in block diagram form or without detail in order not to obscure the understanding of this description.

The present invention includes various steps. The steps of the present invention may be performed by hardware components or may be embodied in machine-executable instructions, which may be used to cause a general-purpose or special-purpose processor or logic circuits programmed with the instructions to perform the steps. Alternatively, the steps may be performed by a combination of hardware and software. The steps have been described as being performed by an adapter card of a user terminal. However, many of the steps described as being performed by a user terminal may be performed by a base station and vice versa. Furthermore, the invention is equally applicable to systems in which terminals communicate with each other without either one being designated as a base station, a user terminal, a remote terminal or a subscriber station. Thus, the present invention is equally applicable and useful in a peer-to-peer wireless network of communications devices using spatial processing. These devices may be cellular phones, PDA's, laptop computers, or any other wireless devices. Generally, since both the base stations and the terminals use radio waves, these communications devices of wireless communications networks may be generally referred to as radios.

The present invention may be provided as a computer program product, which may include a machine-readable medium having stored thereon instructions, which may be used to program a computer (or other electronic devices) to perform a process according to the present invention. The machine-readable medium may include, but is not limited to, floppy diskettes, optical disks, CD-ROMs, and magneto-optical disks, ROMs, RAMs, EPROMs, EEPROMs, magnet or optical cards, flash memory, or other type of media/machine-readable medium suitable for storing electronic instructions. Moreover, the present invention may also be downloaded as a computer program product, wherein the program may be transferred from a remote computer to a requesting computer by way of data signals embodied in a carrier wave or other propagation medium via a communication link (e.g., a modem or network connection).

Many of the methods are described in their most basic form, but steps can be added to or deleted from any of the methods and information can be added or subtracted from any of the described messages without departing from the basic scope of the present invention. It will be apparent to those skilled in the art that many further modifications and adaptations can be made. The particular embodiments are not provided to limit the invention but to illustrate it. The scope of the present invention is not to be determined by the specific examples provided above but only by the claims below.

It should also be appreciated that reference throughout this specification to "one embodiment" or "an embodiment" means that a particular feature may be included in the practice of the invention. Similarly, it should be appreciated that in the foregoing description of exemplary embodiments of the invention, various features of the invention are sometimes grouped together in a single embodiment, Figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

What is claimed is:

1. A machine-readable medium having stored thereon data representing sequences of instructions that, when executed by one or more processors, cause the processors to perform operations comprising:
   dividing a data stream into a plurality of data sub-streams, the data stream being equivalent to a concatenation of the plurality of data sub-streams;
   computing an intermediate error word for each of the plurality of data sub-streams; and
   combining the intermediate error words to produce an error word for the data stream.

2. The medium of claim 1, wherein a first data sub-stream is of a different length than a second data sub-stream.

3. The medium of claim 1, wherein the data sub-streams arrive at arbitrary times.

4. The medium of claim 1, wherein the data sub-streams arrive in a different order than the original order of the data sub-streams in the data stream.

5. The medium of claim 1, wherein the error word and the intermediate error words are produced using a linear code.

6. The medium of claim 5, wherein combining the intermediate error words comprises:
applying a linear operator to each intermediate error word by a factor to produce a result; and
adding the results together to produce the error word.

7. The medium of claim 6, wherein the error word and the intermediate error words comprise cyclic redundancy check (CRC) words.

8. The medium of claim 7, wherein combining the intermediate CRC words comprises calculation of:

$$c = \sum_{j=1}^{M} B_j c_j$$

where c is the CRC word, M is the number of data sub-streams, $B_j$ is an operator for the $j^{th}$ data sub-stream, and $c_j$ is the intermediate CRC word for the $j^{th}$ data sub-stream.

9. The medium of claim 8, wherein:
the operator $B_j$ for the jth data sub-stream comprises:

$$B_j = A^{\sum_{i=j+1}^{M} N_i}$$

where A is a state transition matrix for the CRC word generator and $N_i$ is the length of the ith data sub-stream; and
the factor $B_M$ for the $M^{th}$ data sub-stream of M data sub-streams comprises:

$$B_M = I_P$$

wherein $I_P$ is an identity matrix of size P×P.

10. An error word generator comprising:
a plurality of intermediate error word generators, each intermediate word generator receiving a data sub-stream and producing an intermediate error word for the data sub-stream;
a plurality of linear operators, each linear operator to receive an intermediate error word and produce a result; and
an operator to add the results of the linear operators to produce an error word for a data stream, wherein the data stream is equivalent to a concatenation of the received data sub-streams.

11. The error word generator of claim 10, wherein a first data sub-stream received by the error word generator is of a different length than a second data sub-stream received by the error word generator.

12. The error word generator of claim 10, wherein the data sub-streams received by the error word generator arrive at arbitrary times.

13. The error word generator of claim 10, wherein the data sub-streams received by the error word generator arrive in a different order than the original order of the data sub-streams in the data stream.

14. The error word generator of claim 10, wherein the error word and intermediate error words are CRC words.

15. The error word generator of claim 10, wherein adding the results of the linear operators comprises calculation of:

$$c = \sum_{j=1}^{M} B_j c_j$$

where c is the CRC word, M is the number of data sub-streams, $B_j$ is an operator for the jth data sub-stream, and $c_j$ is the intermediate CRC word for the jth data sub-stream.

16. The error word generator of claim 15, wherein:
the operator $B_j$ for the $j^{th}$ data sub-stream comprises:

$$B_j = A^{\sum_{i=j+1}^{M} N_i}$$

where A is a state transition matrix for the CRC word generator and $N_i$ is the length of the $i^{th}$ data sub-stream; and
the factor $B_M$ for the $M^{th}$ data sub-stream of M data sub-streams comprises:

$$B_M = I_P$$

wherein $I_P$ is an identity matrix of size P×P.

17. A method for producing an error word for a data stream comprising:
producing a first error word for a data stream;
dividing the data stream into a plurality of data sub-streams;
transmitting the plurality of data sub-streams and the first error word;
receiving the plurality of data sub-streams and the first error word;
producing an intermediate error word for each of the plurality of data sub-streams; and
combining the intermediate error words to produce a second error word for the data stream.

18. The method of claim 17, further comprising comparing the first error word with the second error word.

19. The method of claim 17, wherein a first data sub-stream is of a different length than a second data sub-stream.

20. The method of claim 17, wherein the data sub-streams arrive at arbitrary times.

21. The method of claim 17, wherein the data sub-streams arrive in a different order than the original order of the data sub-streams in the data stream.

22. The method of claim 17, wherein the error word and the intermediate error words are produced using a linear code.

23. The method of claim 22, wherein combining the intermediate error words comprises:
applying a linear operator to each intermediate error word by a factor to produce a result; and
adding the results together to produce the error word.

24. The method of claim 23, wherein the first and second error words and the intermediate error words comprise cyclic redundancy check (CRC) words.

25. The method of claim 17, wherein combining the intermediate error words comprises calculation of:

$$c = \sum_{j=1}^{M} B_j c_j$$

where c is the second CRC word, M is the number of data sub-streams, $B_j$ is an operator for the jth data sub-stream, and $c_j$ is the intermediate CRC word for the jth data sub-stream.

26. The method of claim 25, wherein:
the operator $B_j$ for the $j^{th}$ data sub-stream comprises:

$$B_j = A^{\sum_{i=j+1}^{M} N_i}$$

where A is a state transition matrix for the CRC word generator and $N_i$ is the length of the $i^{th}$ data sub-stream; and the factor $B_M$ for the Mth data sub-stream of M data sub-streams comprises:

$$B_M = I_P$$

wherein $I_P$ is an identity matrix of size P×P.

27. An error detection system comprising:
a first error word generator to produce a first error word for a data stream; and
a second error word generator to produce a second error word for the data stream, the second error word generator comprising:
 a plurality of intermediate error word generators, each intermediate word generator to receive a portion of the data stream and produce an intermediate error word for the portion of the data stream,
 a plurality of linear operators, each linear operator to receive an intermediate error word from an intermediate error word generator and produce a result, and
 an operator to add the results from the plurality of linear operators to produce a second error word.

28. The error detection system of claim 27, further comprising a comparator to compare the first error word with the second error word.

29. The error detection system of claim 27, wherein the first and second error words and the intermediate error words are cyclic redundancy (CRC) words.

30. The error detection system of claim 27, wherein adding the results from the plurality of linear operators comprises calculation of:

$$c = \sum_{j=1}^{M} B_j c_j$$

where c is the second error word, M is the number of data sub-streams, $B_j$ is an operator for the $j^{th}$ data sub-stream, and $c_j$ is the intermediate error word for the $j^{th}$ data sub-stream.

31. The error detection system of claim 30, wherein:
the operator $B_j$ for the $j^{th}$ data sub-stream comprises:

$$B_j = A^{\sum_{i=j+1}^{M} N_i}$$

where A is a state transition matrix for the first error word generator and $N_i$ is the length of the $i^{th}$ data sub-stream; and the factor $B_M$ for the Mth data sub-stream of M data sub-streams comprises:

$$B_M = I_P$$

wherein $I_P$ is an identity matrix of size P×P.

32. A method for error detection for a data stream comprising:
calculating a first CRC word for a set of data and appending the first CRC word to the set of data to form a data stream;
dividing the data stream into a first data sub-stream and a second data sub-stream;
transmitting the first data sub-stream and the second data sub-stream;
receiving the first data sub-stream and the second data sub-stream and recovering the first CRC word;
calculating a first intermediate CRC word for the first data sub-stream and a second intermediate CRC word for the second data sub-stream;
multiplying the first intermediate CRC word by a first factor to produce a first product; and
summing the first product and the second intermediate CRC word to produce a second CRC word.

33. The method of claim 32, further comprising comparing the first CRC word with the second CRC word.

34. The method of claim 32, wherein the first data sub-stream is of a different length than the second data sub-stream.

35. The method of claim 32, wherein the first and second data sub-streams arrive at arbitrary times.

36. The method of claim 32, wherein the first and second data sub-streams arrive in a different order than the original order of the data sub-streams in the data stream.

37. The method of claim 32, wherein the first factor comprises:

$$B_1 = A^{N_2}$$

where A is a state transition matrix for generation of a CRC word and $N_2$ is the length of the second data sub-stream.

38. An interchangeable computer adapter card comprising:
a master control unit to control operations performed on the card;
a radio section to transmit and receive radio signals to and from the card;
a physical layer processor comprising an error word generator, the error word generator comprising:
 a plurality of intermediate error word generators, each intermediate word generator receiving a data sub-stream and producing an intermediate error word for the data sub-stream;
 a plurality of linear operators, each linear operator to receive an intermediate error word and produce a result; and
 an operator to add the results of the linear operators to produce an error word for a data stream that is equivalent to a concatenation of the received data sub-streams.

39. The adapter card of claim 38, wherein a first data sub-stream received by the error word generator is of a different length than a second data sub-stream received by the error word generator.

40. The adapter card of claim 38, wherein the data sub-streams received by the error word generator arrive at arbitrary times.

41. The adapter card of claim 38, wherein the data sub-streams received by the error word generator arrive in a different order than the original order of the data sub-streams in the data stream.

42. The adapter card of claim 38, wherein the error word and intermediate error words are CRC words.

43. The adapter card of claim 38, wherein adding the results of the linear operators comprises calculation of:

$$c = \sum_{j=1}^{M} B_j c_j$$

where c is the CRC word, M is the number of data sub-streams, $B_j$ is an operator for the jth data sub-stream, and $c_j$ is the intermediate CRC word for the jth data sub-stream.

44. The adapter card of claim 43, wherein:
the operator $B_j$ for the $j^{th}$ data sub-stream comprises:

$$B_j = A^{\sum_{i=j+1}^{M} N_i}$$

where A is a state transition matrix for the CRC word generator and $N_i$ is the length of the $i^{th}$ data sub-stream; and
the factor $B_M$ for the $M^{th}$ data sub-stream of M data sub-streams comprises:

$$B_M = I_P$$

wherein $I_P$ is an identity matrix of size P×P.

* * * * *